United States Patent
Bourque

(10) Patent No.: US 8,229,518 B2
(45) Date of Patent: Jul. 24, 2012

(54) DUTY CYCLE ESTIMATION SYSTEM AND METHOD

(75) Inventor: Stephen Bourque, Littleton, MA (US)

(73) Assignee: LoJack Operating Company, LP, Canton, MA (US)

( * ) Notice: Subject to any disclaimer, the term of this patent is extended or adjusted under 35 U.S.C. 154(b) by 456 days.

(21) Appl. No.: 12/589,288

(22) Filed: Oct. 21, 2009

(65) Prior Publication Data

US 2011/0092163 A1    Apr. 21, 2011

(51) Int. Cl.
*H04B 17/00* (2006.01)
*H04B 1/40* (2006.01)

(52) U.S. Cl. .................... 455/574; 455/67.11

(58) Field of Classification Search ............... 455/67.11, 455/572, 574
See application file for complete search history.

(56) References Cited

U.S. PATENT DOCUMENTS

| | | | |
|---|---|---|---|
| 4,177,466 A | 12/1979 | Regan | |
| 4,818,998 A | 4/1989 | Apsell et al. | |
| 6,058,320 A * | 5/2000 | Yokota | 455/574 |
| 6,229,988 B1 | 5/2001 | Stapefeld et al. | |
| 6,331,825 B1 | 12/2001 | Ladner et al. | |
| 6,735,455 B2 * | 5/2004 | Naito et al. | 455/574 |
| 7,375,654 B2 | 5/2008 | Culpepper et al. | |
| 7,593,711 B2 | 9/2009 | Romano et al. | |
| 8,126,517 B2 * | 2/2012 | Ashbrook et al. | 455/574 |
| 2001/0005686 A1 * | 6/2001 | Naito et al. | 455/574 |
| 2002/0058537 A1 * | 5/2002 | Bhatoolaul et al. | 455/572 |
| 2008/0238636 A1 | 10/2008 | Birging et al. | |
| 2010/0003950 A1 * | 1/2010 | Ray et al. | 455/404.1 |
| 2010/0190505 A1 * | 7/2010 | Shiizaki et al. | 455/452.1 |

OTHER PUBLICATIONS

Written Opinion from the International Searching Authority, International Application No. PCT/US2010/002253, mailed Oct. 8, 2010, 9 pgs. (unnumbered).
U.S. Appl. No. 12/462,949, filed Aug. 12, 2009, Romano et al.

* cited by examiner

*Primary Examiner* — Blane J Jackson
(74) *Attorney, Agent, or Firm* — Goodwin Procter LLP

(57) ABSTRACT

A method of operating a vehicle locating unit wherein an activation signal is received when the vehicle is stolen and in response to the activation signal, a signal indicating the vehicle has been stolen is transmitted. The receiver is energized for an actual duration $N_{on}$ periodically to listen for the activation and other signals. Estimating how long the receiver has been on includes incrementing a counter at a count resolution where $N_{on}$ is typically at least sometimes less than the count resolution. Estimating the total amount of time the receiver was energized is based on a measured on time after it converges with the actual on time.

20 Claims, 3 Drawing Sheets

DUTY CYCLE ESTIMATION SYSTEM AND METHOD

FIELD OF THE INVENTION

The subject invention relates to duty cycle determinations and estimations.

BACKGROUND OF THE INVENTION

The duty cycle of a device is the duration the device is active in some period of time. Determining the duty cycle is important in many systems.

In but one example, the applicant's successful LoJack® system includes a vehicle locating unit (VLU) hidden in a vehicle. See U.S. Pat. Nos. 4,177,466 and 4,818,998 incorporated herein by this reference. The VLU includes a receiver and a transmitter (e.g., a transponder). When the vehicle is reported stolen, an RF signal to that effect is transmitted from a base station via one or more relay towers to the VLU in the stolen vehicle to activate the VLU transmitter. Police cars equipped with a vehicle tracking unit (VTU) can detect and track the signal emitted by the VLU in order to retrieve the stolen vehicle.

The battery providing power to the VLU has a finite capacity and power is consumed, inter alia, every time the VLU receiver is energized to listen for activation or other informational signals (e.g., synchronization signals). To save battery power, the VLU receiver is energized only periodically (e.g., every minute or two) and even then only for a very short time, typically between 15 and 50 milliseconds. If no activation or informational signal is received, no action is taken and the VLU receiver is deenergized to save battery power. See, for example, U.S. Pat. No. 6,229,988, U.S. patent application Ser. Nos. 11/131,847, 12/462/949, and U.S. Pat. No. 6,229,988, all incorporated herein by this reference.

BRIEF SUMMARY OF THE INVENTION

It is useful to know the battery life remaining for a given VLU. That way, the consumer can be notified, for example, when the battery is near the end of its useful life. Also, if the battery is being drained at a rate greater than expected, the periodicity of the VLU receiver on times could be lengthened to conserve battery power. A typical VLU battery is expected to provide sufficient power for a VLU operated for approximately ten years.

Known battery monitoring circuits are expensive to implement and thus are not desirable. With a sufficiently accurate high frequency clock (also called an oscillator), the length of time the VLU receiver is energized could be determined and, since the current drawn by the VLU receiver when it is energized is known, the remaining battery life could be estimated. But, in a VLU, the clock frequency (for example, 32,768 Hz) is converted to a much lower resolution called an "age count." Typically this count is incremented at a cycle time (e.g., 125 ms) much longer than the normal on time of the VLU receiver. The reason is to lessen the storage requirement since a count only every 125 ms will not overflow a 32 bit memory for about 17 years. Counting at 32,768 Hz would require a much larger memory to maintain the count for this long. Also, other VLU circuitry and software dependent on a clocking function would be more difficult to design based on a high resolution clock.

Accordingly, the age count resolution is greater than the typical length of time the VLU receiver is energized. So, if the VLU receiver is energized for 15 ms, for example, and the count does not increment, the measured VLU receiver on time would be zero. If, on the other hand, the VLU receiver is energized for 15 ms and during that time the count does increment, the measured VLU receiver on time would be the count resolution, in the example above, 125 ms. Both measurements, of course, are inaccurate.

The invention, in one preferred embodiment, provides a new system for and method of determining the duty cycle of a device such as a VLU receiver. Such a system and method does not typically require an expensive battery monitoring circuit. Large memories and/or difficult to design circuitry and/or software are not needed.

The invention results, in part, from the realization that, in one embodiment, even though the count resolution is greater than the time the device is typically active or energized, the inaccurate measurements made at the count resolution converge to an accurate result over a sufficiently long period of time due to the law of large numbers. The only typical restriction for convergence is that the periodicity of the operation of the device is not correlated to the count cycle.

The subject invention features a method of operating a vehicle locating unit. One preferred method comprises receiving an activation signal when the vehicle is stolen and transmitting, in response to the activation signal, a signal indicating the vehicle has been stolen. The receiver is energized for an actual duration $N_{on}$ periodically to listen for transmitted activation and other signals. An estimation is made regarding how long the receiver has been on at some time period T. A counter is incremented at a count resolution where $N_{on}$ is typically at least sometimes less than the count resolution. For example, $N_{on}$ may be 15-20 ms and yet the count resolution may be 125 ms. When the receiver is energized for an actual on time $N_{on}$ and the count does not increment, the measured receiver on time is set to a first value (e.g., 0). When the receiver is energized for an actual on time $N_{on}$ and the count does increment, the measured receiver on time is set to a second value. For example, if the count increments once, the second value is 125 ms. The total amount of time the receiver was energized is then estimated based on the first and second values after the measured on times converge with the actual on times.

Typically, the receiver is energized via a battery and the method further includes calculating battery usage based on the estimation. Typically, the second value is the number count increments multiplied by the count resolution.

A vehicle locating unit in accordance with the subject invention features a transmitter for transmitting a signal indicating the vehicle has been stolen and a receiver for receiving activation and other signals. A batter powers at least the receiver. A processing subsystem controls the transmitter to transmit the signal indicating the vehicle has been stolen upon receipt of an activation signal. The processing subsystem is further configured to energize the receiver for an actual duration $N_{on}$ periodically to save battery power and to estimate how long the receiver has been on. This estimation involves incrementing a counter at a count resolution where $N_{on}$ is typically at least sometimes less than the count resolution. When the receiver is energized for an actual on time $N_{on}$ and the count does not increment, a measured receiver on time is set to a first value. When the receiver is energized for an actual on time $N_{on}$ and the count does increment, a measured receiver on time is set to a second value. The total amount of time the receiver was energized is estimated on the first and second values after the measured on times converge with the actual on times. Typically, the processing subsystem is further configured to calculate battery usage based on the estimation.

More generally, the invention features a method comprising powering an electronic device when active via a battery, energizing the electronic device periodically for an actual duration $N_{on}$, and incrementing a counter at a count resolution where $N_{on}$ is typically at least sometimes less than the count resolution. When the device is energized for an actual on time $N_{on}$ and the count does not increment, a measured device on time is set to be a first value. When the device is energized for an actual on time $N_{on}$ and the count does increment, a measured device on time is set to be a second value. The total amount of time the device was energized is estimated based on the first and second values when the measured device on times converge with the actual device on times.

In one version, an electronic device is periodically activated for an actual duration $N_{on}$. A battery powers the electronic device. A power usage estimator subsystem includes a counter incremented at a count resolution where $N_{on}$ is typically at least sometimes less than the count resolution. There are means for setting a measured device on time based on the number of count increments and the count resolution when the device is energized for an actual on time $N_{on}$ and the count does increment, and means for estimating the total amount of time the device was energized based on the measured device on times after the measured device on times converge with the actual device on times.

A duty cycle determination method is also disclosed for device having a duty cycle $$D = \frac{\tau}{T}$$

where $\tau$ is the actual duration the device is active and T is a period. One preferred method comprises incrementing a counter ever count cycle wherein the count is greater than $\tau$. When the device is active for an actual on time $N_{on}$ and the count does not increment, the measured device on time is set to a first value, and when the device is active for an actual on time $N_{on}$ and the count does increment, the measured device on time is set to a second value. The total amount of time the device was active is based on the first and second values when the measured device on times converge with $\tau$.

When the device is battery operated, the method may further include calculating battery usage based on the estimation. In one preferred embodiment, the first value is 0 and may be ignored in the estimation. The second value is typically a function of the number of count increments occurring while the device is energized, e.g., the second value is the number of count increments multiplied by the count cycle.

The subject invention, however, in other embodiments, need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
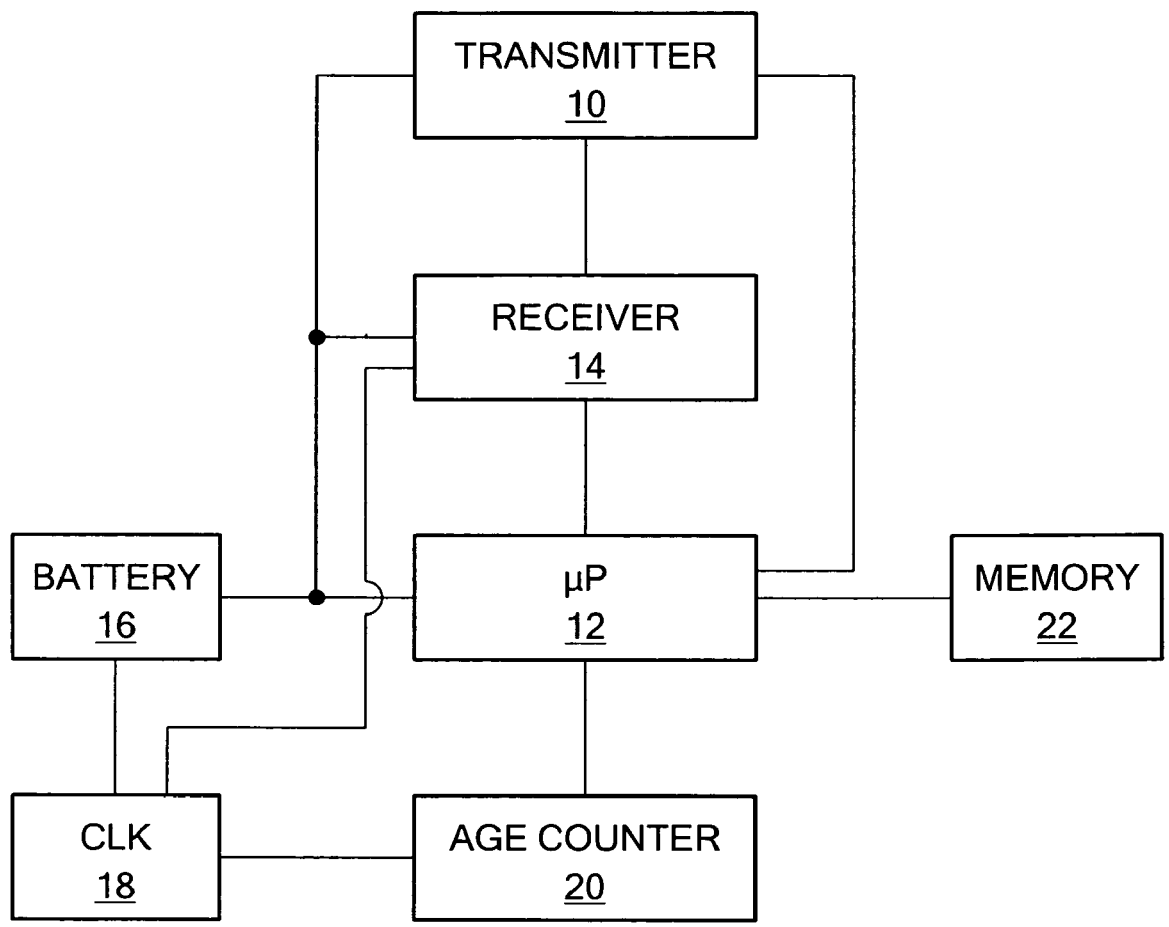
FIG. 1 is a block diagram showing several of the primary components associated with a typical vehicle locating unit in accordance with the subject invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

FIG. 1 shows an example of the primary components associated with a typical vehicle locating unit. Transmitter 10 is activated by processor 12 when receiver 14 receives the appropriate signal. Battery pack 16 serves as either the primary or backup power supply for the various subsystems in the VLU including receiver 14. Processor 12 (or another electronic circuit, combination of circuits, or a controller, for example) controls the activation of receiver 14 periodically turning it on for a duration $N_{on}$ in order to save battery power. $N_{on}$ typically ranges from 15-50 ms and the receiver is typically reenergized every one or two minutes.

In accordance with the subject invention, it is desirable to estimate the state of battery pack 16. Since the current draw of receiver 14 when it is on and listening for signals from the network of LoJack® towers is known, it is possible to compute the remaining battery life at any given time based on the total time receiver 14 has been on up to that point in time—i.e., the duty cycle of receiver 14. As noted in the background section above, presently available battery monitoring circuits are too expensive to implement.

Clock or oscillator 18, which runs continuously, produces a relatively high frequency (e.g., 32,768 Hz) signal and is used in synchronizing the wake up times of receiver 14 to the LoJack® transmission towers, for timeout functions, and the like. In the new system, age counter 20 is present. It divides the clock signal by some large factor such as 4096 resulting in a resolution or count cycle much greater than the period of time receiver 14 is typically on. In the above example, the count resolution or cycle is 125 ms. But, receiver 14 is typically on for only between 15-50 ms. The reason for this lower count resolution is so the age counter does not overflow a practical memory storage unit (e.g. 32 bit) and also to make it easier to design and implement the software and circuitry dependent on the clocking function.

Figure 2:
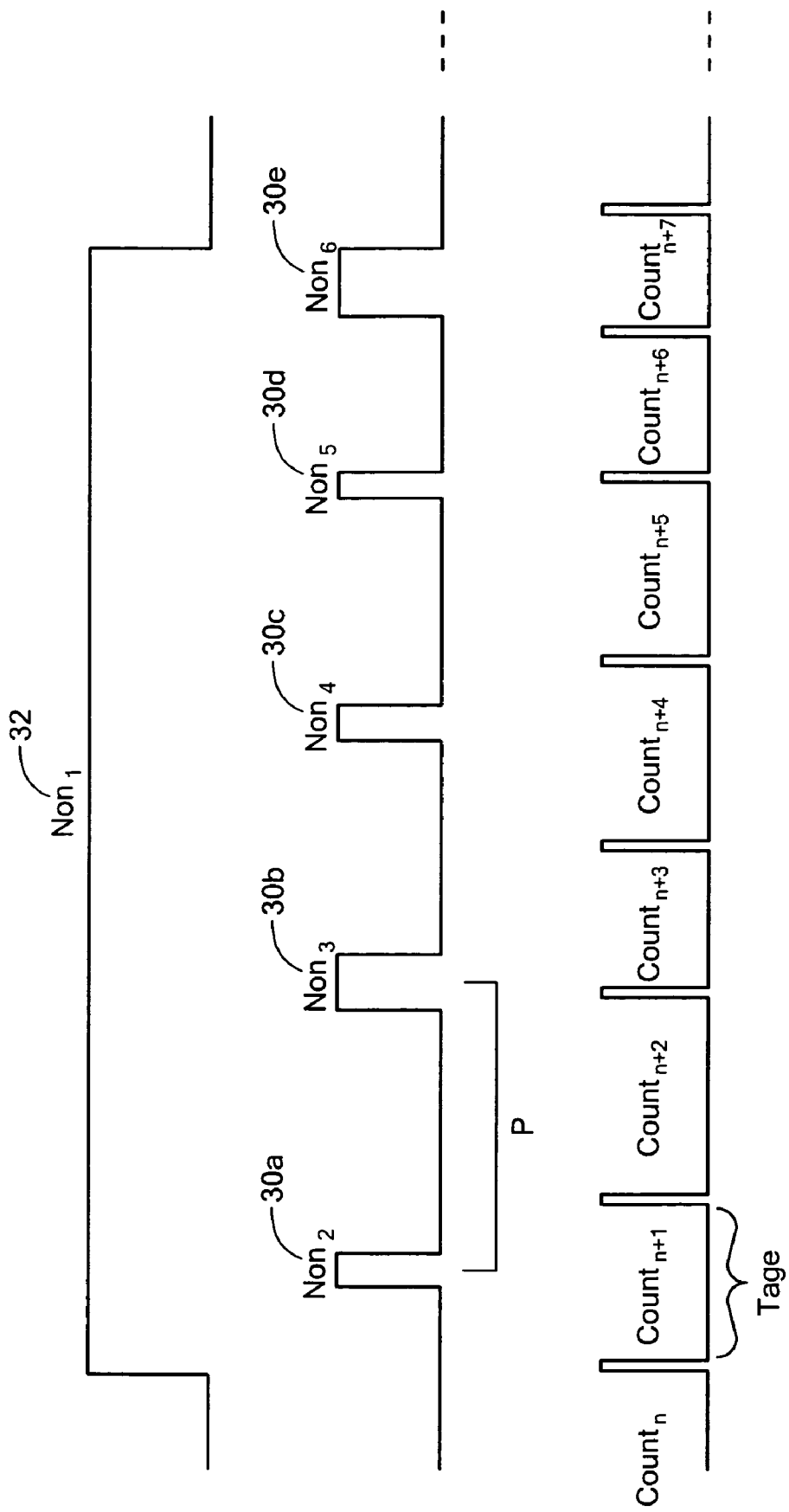
FIG. 2 is a graph showing both a series of device on times and a number of counts produced by the age counter depicted in FIG. 1.

As shown in FIG. 2, receiver 14, FIG. 1 is on for a short time, $N_{on}$ as shown at 30a-e in FIG. 2. Age counter 20, FIG. 1 (which may be programming associated with processor 12) has a count resolution or cycle where the count increments at $T_{age}$, FIG. 2. $T_{age}$ is greater than the typical receiver on time $N_{on}$ as shown but not correlated to the periodicity P of the energized receiver (e.g., P is statistically independent of multiples of 125 ms).

As shown for receiver on time $N_{on2}$, 30a, the count is Count$_{n+1}$ for the entire duration of $N_{on2}$ resulting in an erroneous determination that the receiver was not on at all since Count$_{n+1}$−Count$_{2+1}$=0. In fact, the receiver was on for time $N_{on2}$. For receiver on time $N_{on3}$, 30b, in contrast, the count has incremented from Count$_{n+2}$ to Count$_{n+3}$ resulting in an erroneous determination that the receiver was on for one count cycle or for the count resolution, in this example, 125 ms. In fact, the receiver was on for a far less time $N_{on3}$, (e.g., between 15-50 ms).

In total, the receiver has only been on for $N_{on2}+N_{on3}+\ldots N_{on6}$, etc. (approximately 100 ms in this example) but since the count resolution or count cycle is much greater than the receiver on time, the estimator function predicts the receiver was on for 0+125 ms+0+125 ms+0 or 250 ms.

Still, there are two characteristics of the way the VLU operates that can be exploited in the subject invention. First, the times at which the VLU receiver must be turned on are not, in general, multiples of the count cycle or resolution (in this example 125 ms). Second, a typical VLU operates for a very long time and thus has literally months and years, millions of receiver operations, to compute battery usage values.

Because of the first consideration, the receiver start times may be considered to fall randomly with respect to the cycles of the age clock or the count; that is, the count and receiver operating times are independent random variables. In fact, the receiver does share the 32,768 oscillator with the age clock, but because the age period is much greater than the oscillator, this dependence can be ignored. Essentially, the receiver start and stop times will appear to be continuous (as opposed to discrete) from the perspective of the age clock.

Because of the second consideration, the law of large numbers serves to drive the results to the desired accuracy after convergence. In fact, in simulation, the approximations converge to accurate results in less than a day.

As noted above, the duty cycle estimation function yields a series of values or results that are individually inaccurate, but taken as an ensemble, the set converges towards an accurate estimation of device on times and thus an accurate estimation of consumed energy. The measurements that are artificially low (e.g., 0) are offset by those that are artificially high (e.g., 125) in a manner that cancels the error as the number of measurements increases.

A side benefit of the technique is that it reduces processor computation time compared to conventional methods. When the receiver is on but the count has not incremented (as discussed above for receiver on time $N_{on2}$), the result, namely 0 in this example, can be ignored, requiring no further processing. Instead, all that need be stored is the present receiver on time at a multiple of the count resolution (e.g., 125 ms) added to the previously stored number in memory 22, FIG. 1. Over a long period of time (e.g., a day) that number will converge to the actual receiver on time total. That is, the measured duty cycle will converge to the actual duty cycle.

Then, battery life can be estimated by, inter alia, correlating the known average receiver current draw to the measured total on time for the receiver. Other circuits that consume power, such as the transmitter, the microprocessor, and the like, typically operate at fixed times or rates, and thus do not require this statistical technique. Thus, the known current drawn by these circuits can be added, if needed, to the battery life estimation. All of this functionality including the estimation function can be implemented in software operating on microprocessor 12, FIG. 1 or equivalent circuitry such as a controller or the like.

Figure 3:
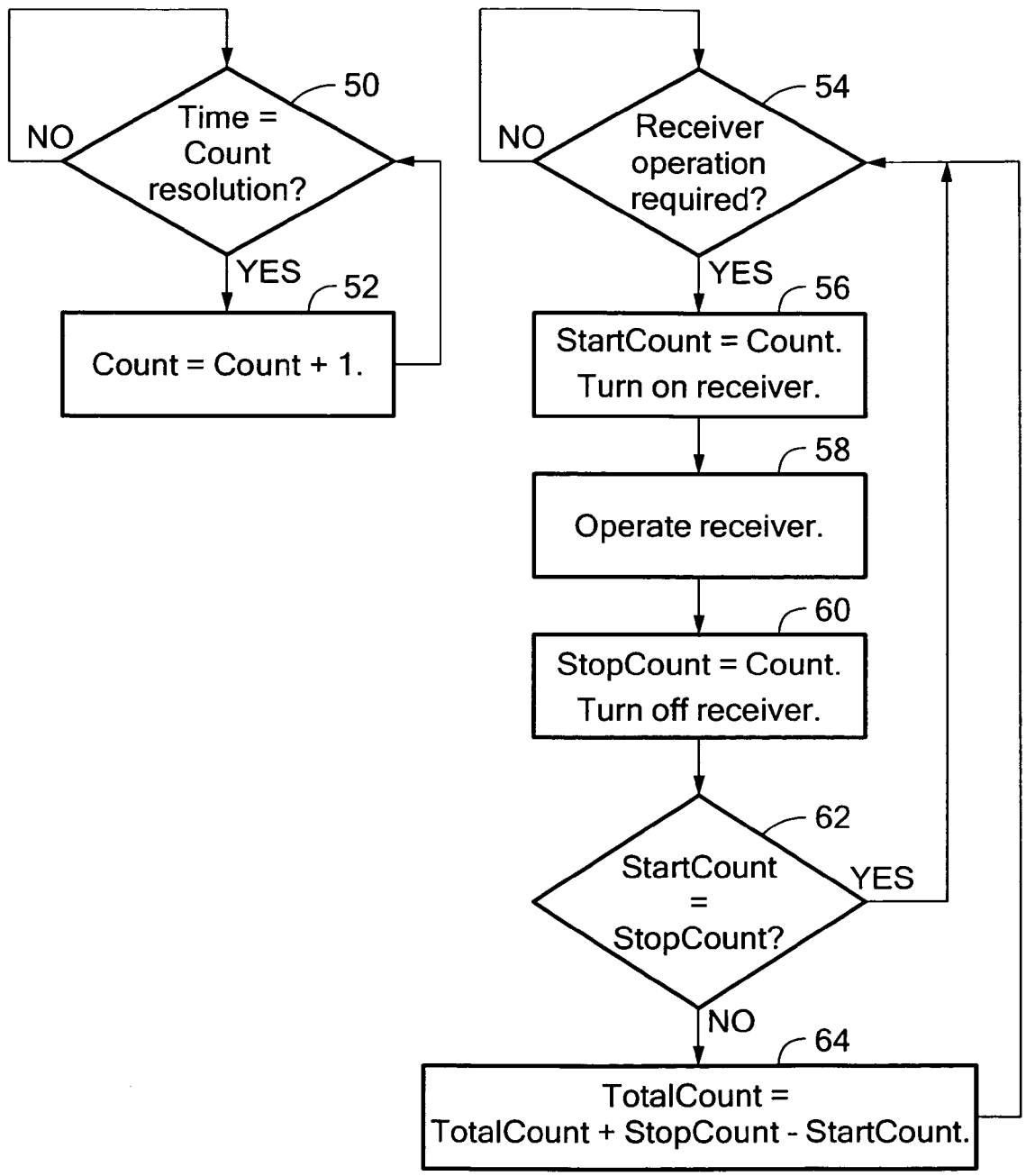
FIG. 3 is a flow chart depicting the primary steps associated with a method of the subject invention which may be implemented in software operating on the processor depicted in FIG. 1.

FIG. 3 depicts one design of such software. At the count resolution, step 50, the counter increments (e.g., by one) every count cycle as shown in FIG. 2, step 52, FIG. 3. In parallel with this, the processor performs its radio receiver tasks. When the receiver must be turned on (step 56), processor 12, FIG. 1 temporarily stores the value of the age counter as StartCount, step 56, FIG. 3 when it turns on the receiver, keeps it on as needed (for typically 15 ms to 50 ms) step 58, then stores the age counter as Stop Count, step 60, when it turns off the receiver. If StartCount and StopCount are equal, step 62, no further action is needed. There is no reason to store a zero or to add it to the total count. If they are unequal, the difference (StopCount−StartCount) is added to the receiver on time accumulator TotalCount, step 64. Memory 22, FIG. 1 typically stores the total accumulated count and receiver. The processor 12 is configured (programmed) to estimate the battery usage based on the added receiver on times and the stored value for the average current drawn by the receiver.

Accordingly, the means for determining every count transmission whether or not the device is active, the means for adding the total time the device was deemed active, the means for estimating the remaining battery power, and in general, the means for estimating the duty cycle including the means for storing a summation of all the device active durations can thus be implemented in software operating on an appropriate processor, electronic circuitry, or controller as discussed herein.

To apply some mathematical rigor to the technique, $T_{xtal}$ is the period of the oscillator and then:

$$f_{xtal} = 32768 \cdot \text{Hz, and} \tag{1}$$

$$T_{xtal} = \frac{1}{f_{xtal}}. \tag{2}$$

The Age clock will divide the oscillator clock by $N_{Age}$:

$$N_{Age} = 2^{12}, \text{ and} \tag{3}$$

$$T_{Age} = N_{Age} \cdot T_{xtal}. \tag{4}$$

To describe the technique, a signal is created representing the receiver operating periods that is random with respect to the timebase. For the purpose of this analysis, if the signal is periodic, it provides two advantages: (1) it stresses this technique more than an aperiodic signal would since periods chosen near multiples of the Age timebase will require more time to converge, and (2) it is simpler to construct in a mathematical model.

So, we define the receiver as turning on every $N_{total}$ counts (i.e. $t_{total}$ seconds, where $t_{total} = N_{total} \cdot T_{xtal}$) for a duration of $N_{on}$ counts (i.e. $t_{on} = N_{on} \cdot T_{xtal}$). The probability of a "hit"—that is, of a transition of the Age counter occurring during the receiver operation is given by:

$$P_{hit} = \begin{cases} \dfrac{N_{on}+1}{N_{Age}} & \text{for } N_{on}+1 < N_{age} \\ 100\% & \text{otherwise.} \end{cases} \tag{5}$$

We can safely ignore all the cases in which the probability of catching a transition of Age is 100%, for in these instances, battery usage can be estimated with complete fidelity. These intervals need not be considered in this analysis, but are accounted for in FIG. 3, step 60.

The actual duty cycle of the periodic signal is $D_{actual}$:

$$D_{actual} = \frac{t_{on}}{t_{total}} = \frac{N_{on} \cdot T_{xtal}}{N_{total} \cdot T_{xtal}} \approx \frac{N_{on}}{N_{total}} \tag{6}$$

Again, recall that in this technique, for every "hit"—every transition of Age that occurs during receiver operation a full $N_{Age}$ period is counted, and for every "miss" the count is zero. Thus, the measured duty cycle, $D_{meas}$, is:

$$D_{meas} = \frac{P_{hit} \cdot N_{age}}{N_{total}} = \frac{\frac{N_{on}+1}{N_{age}} \cdot N_{age}}{N_{total}} = \frac{N_{on}+1}{N_{total}} \quad (7)$$

Finally since $N_{on} \gg 1$, it can be seen that the actual and measured duty cycles are approximately equal:

$$D_{meas} = \frac{N_{on}+1}{N_{total}} \cong \frac{N_{on}}{N_{total}} = D_{actual} \text{ for } N_{on} \gg 1 \quad (8)$$

Note that the receiver does share the 32768 Hz oscillator with the Age clock (i.e., receiver operations occur on the transitions of the oscillator), but because the Age period is much greater than the oscillator period, this dependence can be ignored. Essentially, the receiver start and stop times will appear to be continuous (as opposed to discrete) from the perspective of the Age clock. This restriction shows up as a "+1" in the equation (5), requiring an approximation to validate the technique.

Although the subject invention has been described in relation to a LoJack® vehicle locating unit receiver, the invention has applicability for determining the duty cycle of other devices and/or for establishing battery conditions in connection with other systems which rely on battery power.

Thus, although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A method of operating a vehicle locating unit, the method comprising:
   receiving an activation signal when the vehicle is stolen;
   transmitting, in response to the activation signal, a signal indicating the vehicle has been stolen;
   energizing the receiver for an actual duration $N_{on}$ periodically; and
   estimating how long the receiver has been on including:
      incrementing a counter at a count resolution where $N_{on}$ is typically at least sometimes less than the count resolution,
      when the receiver is energized for an actual on time $N_{on}$ and the count does not increment, setting a measured receiver on time to be a first value,
      when the receiver is energized for an actual on time $N_{on}$ and the count does increment, setting a measured receiver on time to be a second value, and
      estimating the total amount of time the receiver was energized based on the first and second values when the measured on times converge with the actual on times.

2. The method of claim 1 in which the receiver is energized via a battery, the method further including calculating battery usage based on the estimation.

3. The method of claim 1 in which the first value is 0.

4. The method of claim 1 in which the second value is a function of the number of count elements occurring while the receiver was energized.

5. The method of claim 4 in which the second value is the number of count increments multiplied by the count resolution.

6. A vehicle locating unit comprising:
   a transmitter for transmitting a signal indicating the vehicle has been stolen;
   a receiver for receiving an activation and other signals;
   a battery powering at least the receiver;
   a processing subsystem controlling the transmitter to transmit the signal indicating the vehicle has been stolen upon receipt of an activation signal, the processing subsystem configured to:
      energize the receiver for an actual duration $N_{on}$ periodically to save battery power, and
      estimate how long the receiver has been on including:
         incrementing a counter at a count resolution where $N_{on}$ is typically at least sometimes less than the count resolution,
         when the receiver is energized for an actual on time $N_{on}$ and the count does not increment, setting a measured receiver on time to be a first value,
         when the receiver is energized for an actual on time $N_{on}$ and the count does increment, setting a measured receiver on time to be a second value, and
         estimating the total amount of time the receiver was energized based on the first and second values when the measured on times converge with the actual on times.

7. The vehicle locating unit of claim 6 in which the processing subsystem is further configured to calculate battery usage based on the estimation.

8. The vehicle locating unit of claim 6 in which the second value is the number of count increments occurring while the receiver was energized.

9. The vehicle locating unit of claim 8 in which the second value is a function of the number of count increments multiplied by the count resolution.

10. A method comprising:
    powering an electronic device when active via a battery;
    energizing the electronic device periodically for an actual duration $N_{on}$;
    incrementing a counter at a count resolution where $N_{on}$ is typically at least sometimes less than the count resolution;
    when the device is energized for an actual on time $N_{on}$ and the count does not increment, setting a measured device on time to be a first value;
    when the device is energized for an actual on time $N_{on}$ and the count does increment, setting a measured device on time to be a second value; and estimating the total amount of time the device was energized based on the first and second values when the measured device on times converge with the actual device on times.

11. The method of claim 10 further including calculating battery usage based on the estimation.

12. The method of claim 10 in which the first value is 0.

13. The method of claim 10 in which the second value is a function of the number of count increments occurring while the device was energized.

14. The method of claim 13 in which the second value is the number of count increments multiplied by the count resolution.

15. A system comprising:
an electronic device periodically activated for an actual duration $N_{on}$;
a battery powering said electronic device; and
a power usage estimator subsystem including:
  a counter incremented at a count resolution where $N_{on}$ is typically at least sometimes less than the count resolution,
  means for setting a measured device on time based on the number of count increments and the count resolution when the device is energized for an actual on time $N_{on}$ and the count does increment; and
  means for estimating the total amount of time the device was energized based on the measured device on times after said measured device on times converge with the actual device on times.

16. A duty cycle determination method for device having a duty cycle $$D = \frac{\tau}{T}$$

where $\tau$ is the actual duration the device is active and T is a period, the method comprising:
  incrementing a counter every count cycle wherein the count cycle is greater than $\tau$;
  when the device is active for an actual on time $N_{on}$ and the count does not increment, setting a measured device on time to be a first value;
  when the device is active for an actual on time $N_{on}$ and the count does increment, setting a measured device on time to be a second value; and
  estimating the total amount of time the device was active based on the first and second values when the measured device on times converge with $\tau$.

17. The method of claim 16 in which the device is battery operated, the method further including calculating battery usage based on the estimation.

18. The method of claim 16 in which the first value is 0 and is ignored in the estimation.

19. The method of claim 16 in which the second value is a function of the number of count increments occurring while the device is energized.

20. The method of claim 16 in which the second value is the number of count increments multiplied by the count cycle.

* * * * *